(12) United States Patent
Lius et al.

(10) Patent No.: US 11,854,292 B2
(45) Date of Patent: Dec. 26, 2023

(54) DISPLAY DEVICE HAVING MULTILAYERED COVER LAYER

(71) Applicant: InnoLux Corporation, Miao-Li County (TW)

(72) Inventors: Chandra Lius, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 17/952,338

(22) Filed: Sep. 26, 2022

(65) Prior Publication Data

US 2023/0126155 A1    Apr. 27, 2023

(30) Foreign Application Priority Data

Oct. 26, 2021 (CN) .......................... 202111247272.8

(51) Int. Cl.

| | |
|---|---|
| G06V 40/13 | (2022.01) |
| G06F 3/044 | (2006.01) |
| G06F 3/041 | (2006.01) |
| H10K 50/86 | (2023.01) |
| H10K 59/12 | (2023.01) |
| H10K 59/40 | (2023.01) |
| H10K 59/65 | (2023.01) |
| H10K 77/10 | (2023.01) |
| G02F 1/1333 | (2006.01) |
| H10K 102/00 | (2023.01) |

(52) U.S. Cl.
CPC ........ *G06V 40/1306* (2022.01); *G06F 3/0412* (2013.01); *G06F 3/0443* (2019.05); *H10K 50/86* (2023.02); *H10K 59/12* (2023.02); *H10K 59/40* (2023.02); *H10K 59/65* (2023.02); *H10K 77/111* (2023.02); *G02F 1/13338* (2013.01); *G02F 1/133305* (2013.01); *G06F 2203/04102* (2013.01); *H10K 2102/311* (2023.02)

(58) Field of Classification Search
CPC .......... G02F 1/133331; G06V 40/1306; G06F 3/044; G06F 3/0443; G06F 3/0445
See application file for complete search history.

(56) References Cited

U.S. PATENT DOCUMENTS

| | | | |
|---|---|---|---|
| 2016/0372704 A1* | 12/2016 | Lee ...................... | H10K 59/12 |
| 2017/0351364 A1* | 12/2017 | Kim ..................... | G06F 3/0443 |
| 2018/0046220 A1* | 2/2018 | Kim ..................... | H01L 23/4985 |
| 2020/0101304 A1* | 4/2020 | Wu ........................ | A61F 2/14 |
| 2020/0245486 A1* | 7/2020 | Choi ..................... | H05K 5/03 |
| 2021/0004124 A1 | 1/2021 | Park | |
| 2021/0032420 A1* | 2/2021 | Jeong ..................... | B32B 7/023 |
| 2021/0064850 A1 | 3/2021 | Lee | |
| 2021/0089636 A1 | 3/2021 | Lee | |
| 2021/0183273 A1 | 6/2021 | Lius | |
| 2021/0256237 A1* | 8/2021 | Kim ..................... | G06F 3/0418 |
| 2021/0367206 A1* | 11/2021 | Li ........................ | H10K 59/12 |

FOREIGN PATENT DOCUMENTS

| | | |
|---|---|---|
| CN | 112131913 A | 12/2020 |
| TW | 202118343 A | 5/2021 |

* cited by examiner

*Primary Examiner* — Yuzhen Shen
(74) *Attorney, Agent, or Firm* — Winston Hsu

(57) ABSTRACT

A display device includes a display panel, a sensing layer disposed on the display panel and including a fingerprint sensor, an optical layer disposed on the display panel, and a cover layer disposed on the optical layer, wherein the cover layer is a multilayer structure.

12 Claims, 12 Drawing Sheets

DISPLAY DEVICE HAVING MULTILAYERED COVER LAYER

BACKGROUND OF THE DISCLOSURE

1. Field of the Disclosure

The present disclosure relates to an electronic device. More particularly, the present disclosure relates to a display device having display and biometric sensing (such as fingerprint or palm-print sensing) functions.

2. Description of the Prior Art

Biometric features (such as fingerprints and palm-prints) may be used for identity recognition. Due to the advantages of fast recognition speed and hard to counterfeit, biometric sensors such as fingerprint sensors which detect fingerprints to perform recognition have been widely used in the field and been integrated into various electronic devices, such as smart phones, tablets, electronic books, or electronic papers, electronic papers to improve convenience and security in user identification.

In order to provide a more convenient user experience, in-screen fingerprint identification technology has been developed in the industry, which integrates the fingerprint sensors into the display panel. However, there are still problems to be improved in current in-screen fingerprint recognition technology. For example, when the thickness of the cover layer of the display panel is too thick, the sensitivities of the fingerprint sensors may be adversely reduced.

SUMMARY OF THE DISCLOSURE

One objective of the present disclosure is to provide a display device with in-screen fingerprint identification function, wherein a cover layer of the display device is formed by coating and/or adhesion processes and has a thinner multilayer structure. In this way, the sensitivities of the fingerprint sensors of the display device may be improved.

According to an embodiment, the present disclosure provides a display device including a display panel, a sensing layer disposed on the display panel and including a fingerprint sensor, an optical layer disposed on the display panel, and a cover layer disposed on the optical layer, wherein the cover layer is a multilayer structure.

These and other objectives of the present disclosure will no doubt become obvious to those of ordinary skill in the art after reading the following detailed description of the embodiment that is illustrated in the various figures and drawings.

DETAILED DESCRIPTION

Figure 1:
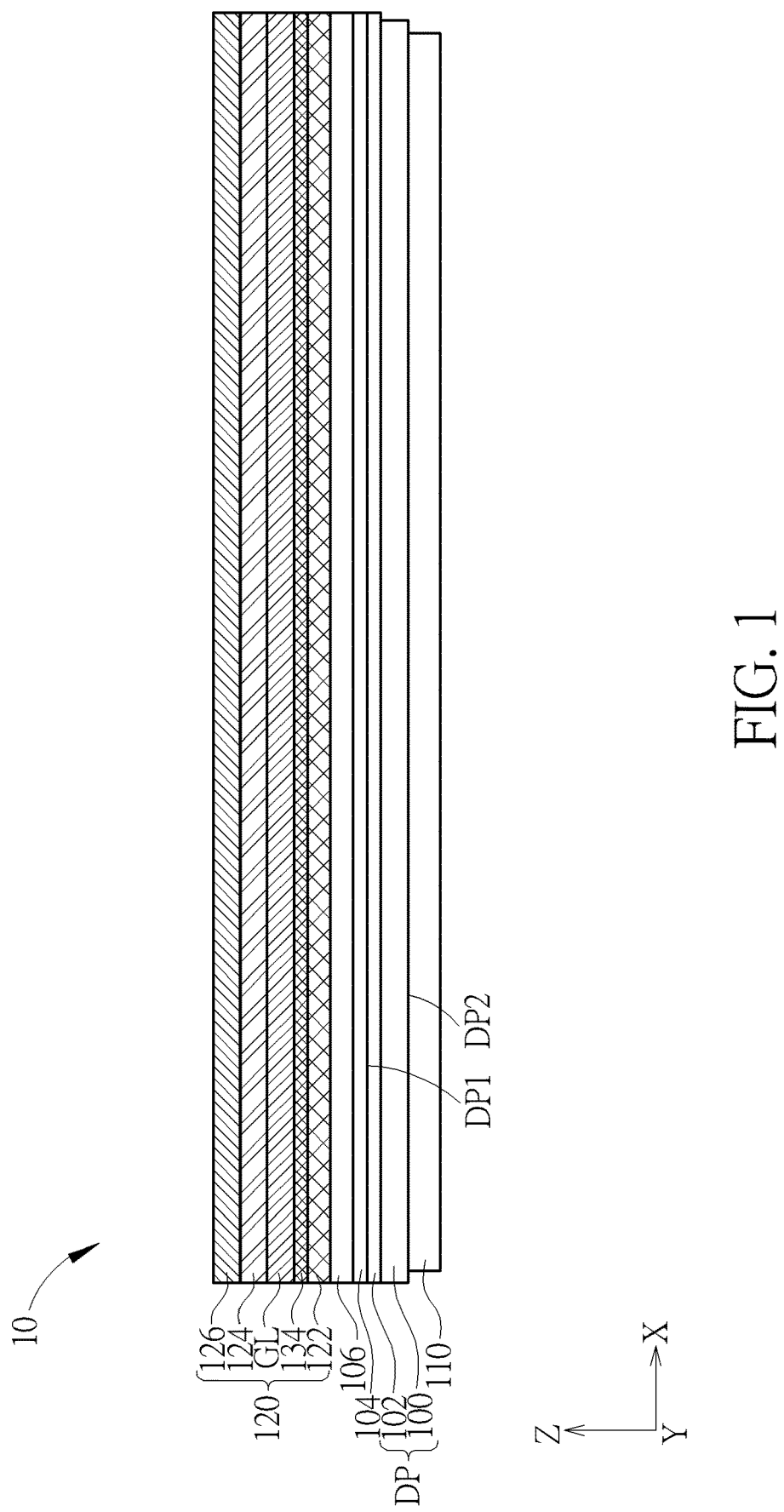
FIG. 1 is a schematic diagram showing a cross-sectional view of a display device according to an embodiment of the present disclosure.

The present disclosure may be understood by reference to the following detailed specification, taken in conjunction with the drawings as described below. It is noted that, for purposes of illustrative clarity and being easily understood by the readers, various drawings of this disclosure show a portion of the electronic device, and certain components in various drawings may not be drawn to scale. In addition, the number and dimension of each component shown in drawings are only illustrative and are not intended to limit the scope of the present disclosure. Other embodiments may be utilized and structural, logical, and electrical changes may be made without departing from the scope of the present disclosure.

Certain terms are used throughout the specification and following claims to refer to particular components. As one skilled in the art will understand, electronic equipment manufacturers may refer to a component by different names. This document does not intend to distinguish between components that differ in name but not function. In the following specification and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it may be directly on or directly connected to the other element or layer, or intervening elements or layers may be presented. In contrast, when an element is referred to as being "directly on" or "directly connected to" another element or layer, there are no intervening elements or layers presented. In addition, a component or layer is referred to as "on another component or layer" based their relative spatial relationship. That is, the component or layer may be above or below the other component or layer depends on the orientation of the device (orientation). The terms such as "up", "down", "front", "back", "left", "right" used in the following specification are based on the accompanying drawings for illustrative purposes, and are not used to limit the scope of the presented disclosure.

The terms "first", "second", "third" or the like may be used in the specification and following claims for the convenience of discriminating various components in the specification or claims. However, these terms are not used to limit these components and these components may be denominate in any other convenient way. These terms do not indicate any order of the components, and do not represent any order of a component to another component or a sequence of the manufacturing steps. Furthermore, the claims may use terminology different from that used in the specification, and may be nominated as "first", "second", "third" or the like in accordance with the order in which the components are declared in the claim. For example, a "first component" in the specification may be nominated as a "second component" in the claims.

It should be noted that the technical features in different embodiments described in the following can be replaced, recombined, or mixed with one another to constitute another embodiment without departing from the spirit of the present disclosure.

The present disclosure provides a display device with an in-screen fingerprint identification function. The display device of the present disclosure may employ any suitable fingerprint identification technology. In some embodiments, the display device of the present disclosure uses capacitive-type fingerprint recognition technology, which has the advantages of mature manufacturing process, easy to integrate with the touch layer, low cost, fast recognition speed, and no needs for lights to perform recognition. In comparison with optical fingerprint recognition technology which needs lights from the screen to perform recognition and is limited to self-light-emitting display devices such as OLED, LED, Mini-LED, micro-LED, QLED, capacitive fingerprint recognition technology may support both self-light-emitting and non-self-light-emitting display devices such as LCD, and has become the mainstream in in-screen fingerprint identification.

FIG. 1 is a schematic diagram showing a cross-sectional view of a display device 10 along the XZ plane (the plane defined by the X direction and the Z direction) according to an embodiment of the present disclosure. The display device 10 may be any kind of display device for displaying images and pictures, and may be a non-self-light-emitting display device (such as LCD) or a self-light-emitting display device (such as OLED, LED, Mini-LED, micro-LED, QLED, EPD, but is not limited thereto.

As shown in FIG. 1, the display device 10 may include a display panel DP, a sensing layer 104 disposed on a front surface (the display surface) DP1 of the display panel DP, an optical layer 106 disposed on the sensing layer 104, and a cover layer 120 disposed on the optical layer 106. According to an embodiment of the present disclosure, the display device 10 may further include a supporting layer 110 disposed on the back surface DP2 of the display panel DP.

According to an embodiment of the present disclosure, the display panel DP includes a substrate 100 and a display device layer 102 disposed on the substrate 100. The substrate 100 may be a hard substrate or a flexible substrate. The material of the substrate 100 may include glass, ceramics, quartz, sapphire, polyimide (PI), polycarbonate (PC), polyethylene terephthalate (PET), silicon oxide coating layer, a silicon nitride coating layer, or a combination thereof, but is not limited thereto. The display device layer 102 may include display units, circuit layers, and encapsulation layers. In some embodiments, the display units may include light-emitting diodes (LEDs), such as organic light-emitting diodes (OLEDs), micro light-emitting diodes (LEDs), mini light-emitting diodes (LEDs), quantum dot light-emitting diode (QLEDs), or any combination or arrangement thereof, but is not limited thereto. In other embodiments, the display units may include a liquid crystal layer. Based on the designs of the display units, the circuit layer may selectively include controlling transistors, driving transistors, scan lines, data lines, pixel electrodes, light-emitting control lines, power lines, ground lines, and/or clock signal lines to control light emitting of each of the display units. According to an embodiment of the present disclosure, the display device layer 102 may include an encapsulation layer (not shown) covering the display units and the circuit layers. The encapsulation layer may be a thin film encapsulation (TFE) stacked layer formed by stacking inorganic-organic-inorganic layers. The encapsulation layer may protect the display device layer 102 from moisture, oxygen or other reactive substances in the environment to ensure normal operation of the display device. The supporting layer 110 provides support to the display panel DP to maintain the structure and/or shape of the display device 10. The material of the supporting layer 110 may include polymers, metals, or other suitable materials, wherein suitable polymer materials may include polyimide (PI), polyethylene terephthalate (PET), or polyvinylchloride (PVC), and suitable metal materials may include copper, iron, aluminum, or an alloy of the above metals, but is not limited thereto.

Figure 8:
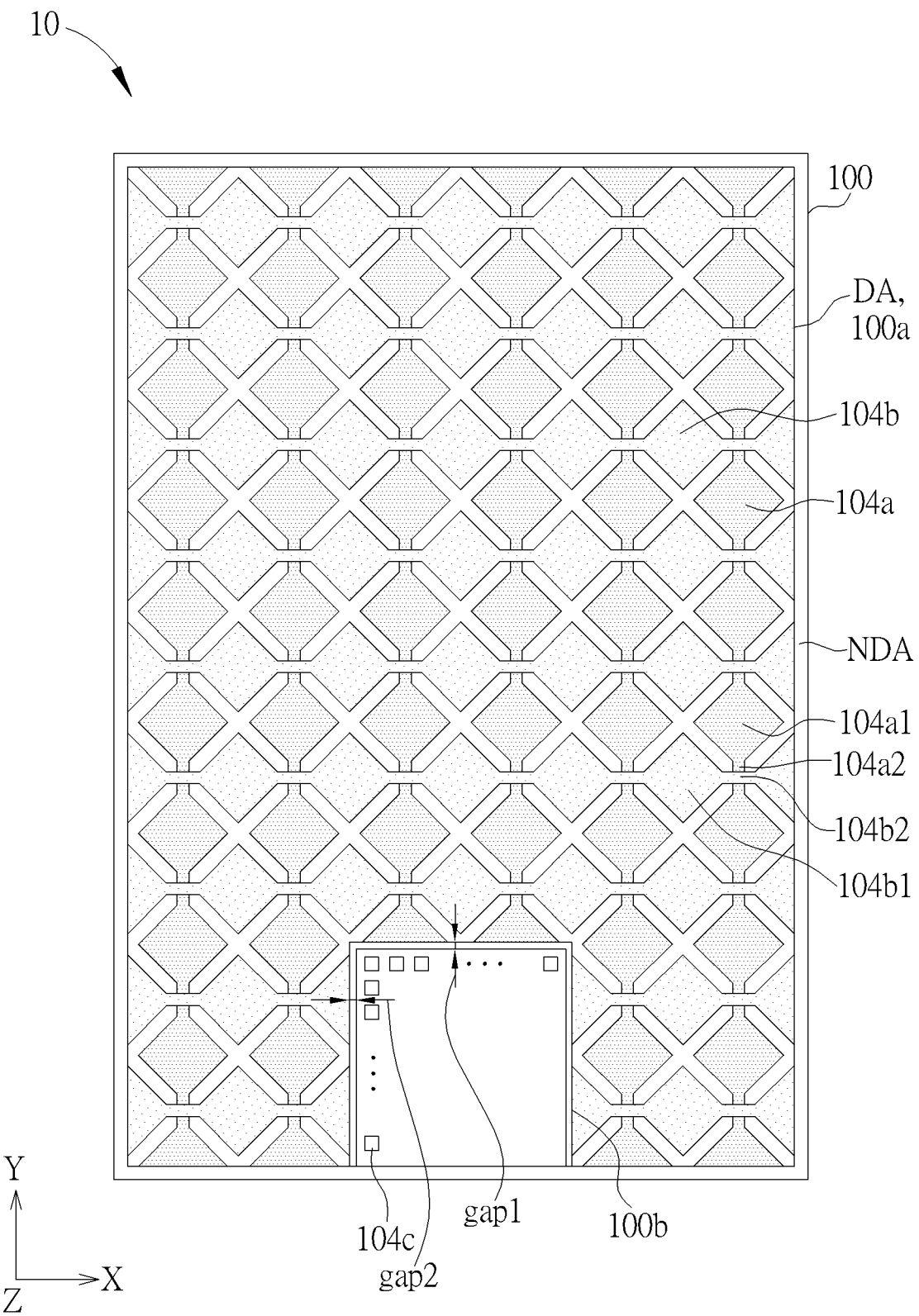
FIG. 8 is a schematic diagram showing a plan view of a display device according to an embodiment of the present disclosure.
Figure 9:
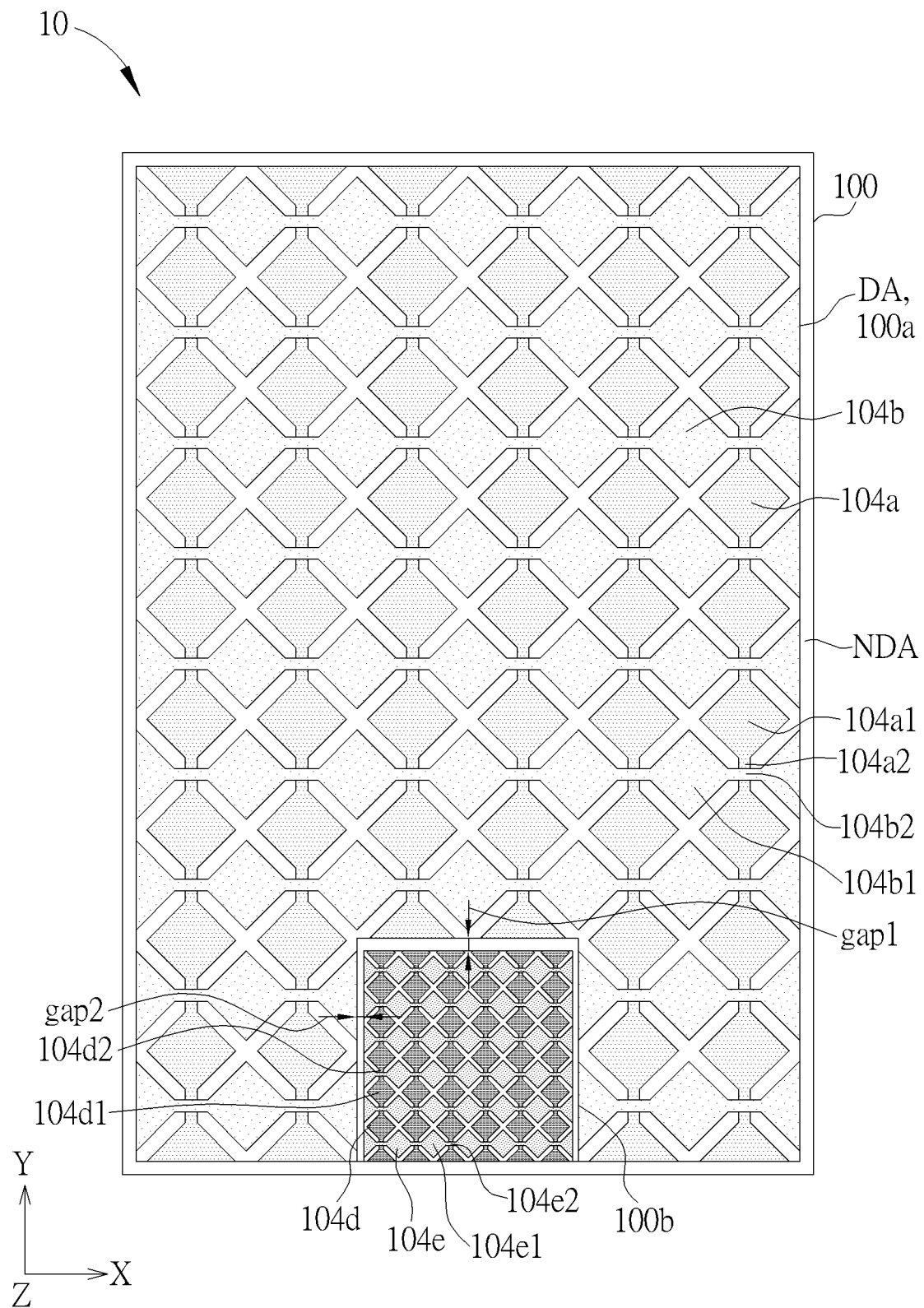
FIG. 9 is a schematic diagram showing a plan view of a display device according to an embodiment of the present disclosure.
Figure 10:
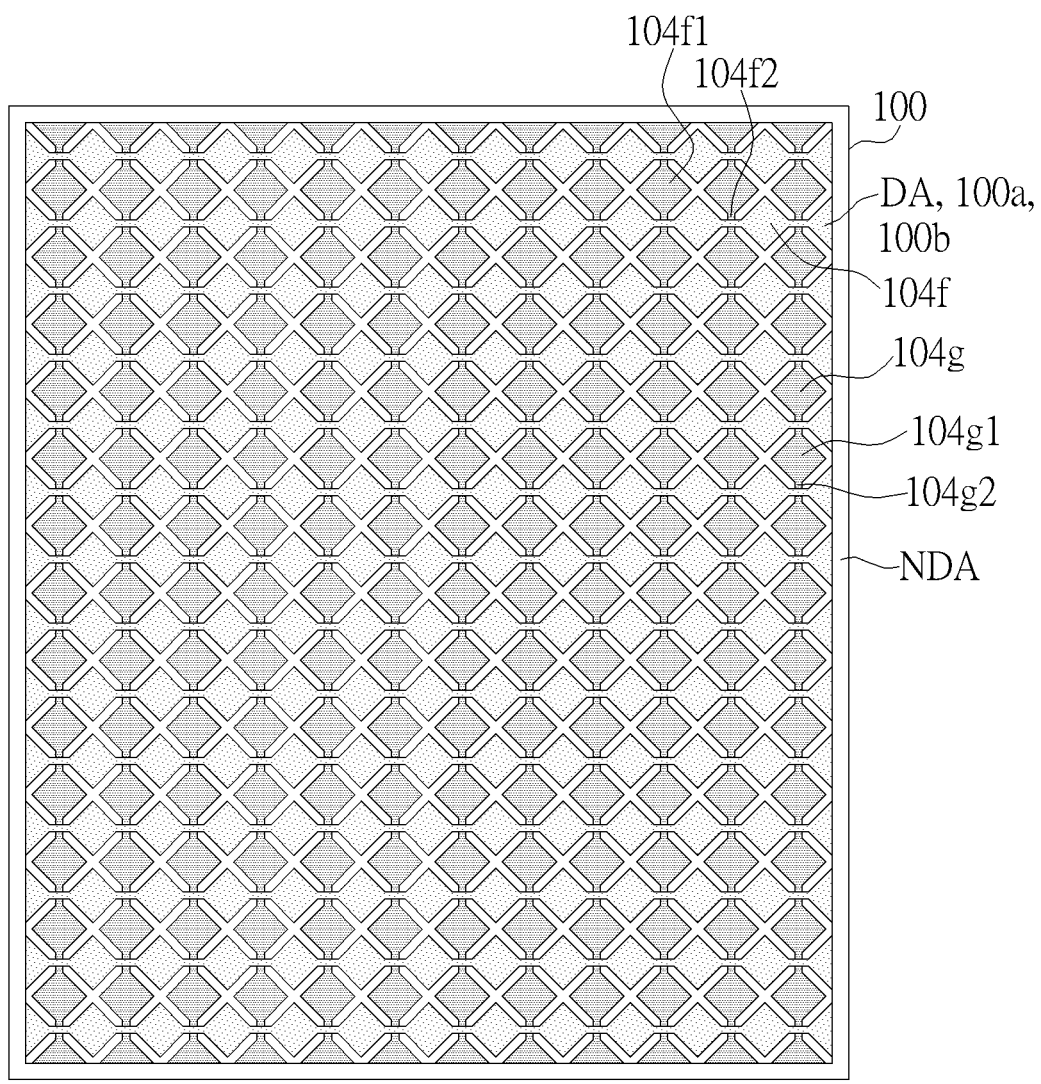
FIG. 10 is a schematic diagram showing a plan view of a display device according to an embodiment of the present disclosure.

The sensing layer 104 may be directly disposed on the display device layer 102 or may be disposed on another substrate and then bonded to the display device layer 102. In other embodiments, the sensing layer 104 may be integrated into the display device layer 102 according to design needs. The sensing layer 104 may include sensors for detecting any kind of external signals, such as a fingerprint sensor and/or a touch sensor. According to an embodiment of the present disclosure, the sensing layer 104 may concurrently include a fingerprint sensor and a touch sensor of the same type (such as capacitive-type) and may be conveniently formed in the same circuit layers for a slimmer shape and/or lower cost. In some embodiments, the fingerprint sensor and the touch sensor of the sensing layer 104 may be located respectively in a fingerprint sensing area and a touch sensing area of the sensing layer 104. In some embodiments, a same sensor in the sensing layer 104 may be used to perform fingerprint sensing and touch sensing at different times by controlling system clock and algorithm. Some embodiments of the fingerprint recognition region, fingerprint sensor, touch sensing area and touch sensor of the display device 10 are shown in FIG. 8, FIG. 9 and FIG. 10, which may be described later.

The optical layer 106 may include an anti-reflection layer, a polarizing layer and/or a filter layer, and/or other optical films for improving the image quality. The optical layer 106 may be formed on the sensing layer 104 by lamination or film coating processes.

The cover layer 120 may be directly formed on the optical layer 106, or may be attached to the optical layer 106 through an adhering process. The cover layer 120 may provide protection for the display panel DP, the sensing layer 104 and the optical layer 10, and/or be used to provide additional optical compensation in the display area. The material of the cover layer 120 may include inorganic material, organic material or a combination thereof, wherein the inorganic material may include glass or other suitable inorganic material, and the organic material may include polyethylene terephthalate (PET), acrylic polymers such as polymethyl methacrylate (PMMA), polyimide (PI), polycarbonate (PC), polysiloxane, high light-transparency polymers, or a combination thereof, but is not limited thereto. The cover layer 120 is the layer been directly touched by the user when using the display device 10.

The cover layer 120 of the display device 10 of the present disclosure may be fabricated through multiple coating and/or adhesion processes. The cover layer 120 may have a multilayer structure. By choosing proper materials and suitable thicknesses of the layers, the cover layer 120 may provide protection to the sensing layer 104 and/or increase the sensitivities of the sensors of the sensing layer 104.

For example, as shown in FIG. 1, the cover layer 120 may include a first layer 124 and a second layer 126 disposed on the first layer 124. Optionally, the cover layer 120 may further include a third layer 122 disposed between the first layer 124 and the optical layer 106, a fourth layer GL disposed between the first layer 124 and the third layer 122, and an adhesive layer 134 disposed between the third layer 122 and the fourth layer GL. According to an embodiment of the present disclosure, the first layer 124 and the third layer 122 may be made of a material with relatively higher toughness, such as PET. The thickness of the first layer 124 and the third layer 122 may range from 30 μm to 100 μm (30 μm≤thickness≤100 μm). For example, the thickness of the first layer 124 and the third layer 122 may be approximately 35 μm, 40 μm, 50 μm, 60 μm, 70 μm, 80 μm, 90 μm, or a thickness within a range defined by the above. The second layer 126 (the layer directly touched by the user) may also be referred to as a hard coating layer. The second layer 126 may be made of a material with relatively higher hardness, better weather resistance and chemical stability, such as PMMA. The thickness of the second layer 126 may range from 4 μm to 20 μm (4 μm≤thickness≤20 μm). For example, the thickness of the second layer 126 may be approximately 5 μm, 10 μm, 15 μm, or a thickness within a range defined by the above. The material of the fourth layer GL between the first layer 124 and the third layer 122 may include glass. The thickness of the fourth layer GL may range from 20 μm to 60 μm (20 μm≤thickness≤60 μm). For example, the thickness of the fourth layer GL may be approximately 25 μm, 30 μm, 40 μm, 50 μm, or a thickness within a range defined by the above. The material of the adhesive layer 134 may include acrylate based adhesive or epoxy adhesive, but is not limited thereto. The thickness of the adhesive layer 134 may range from 20 μm to 50 μm (20 μm≤thickness≤50 μm). For example, the thickness of the adhesive layer 134 may be approximately 25 μm, 30 μm, 40 μm, 45 μm, or a thickness within a range defined by the above. Overall, the thickness of entire cover layer 120 may range from 0.05 mm to 0.5 mm (0.05 mm≤thickness≤0.5 mm) or from 0.1 mm to 0.3 mm (0.1 mm≤thickness≤0.3 mm), wherein the thickness of the first layer 124 or the thickness of the third layer 122 may be larger than the thickness of the second layer 126. In some embodiments, the thickness may be defined as the distance from the top surface to the bottom surface of the measured layer along a normal direction of the substrate 100 in a cross-sectional view. It should be noted that the thickness measurement position should be at least 200 μm away from the edge of the measured layer in order to reduce the deviation caused by uneven thicknesses along the edges, but is not limited thereto.

Figure 2:
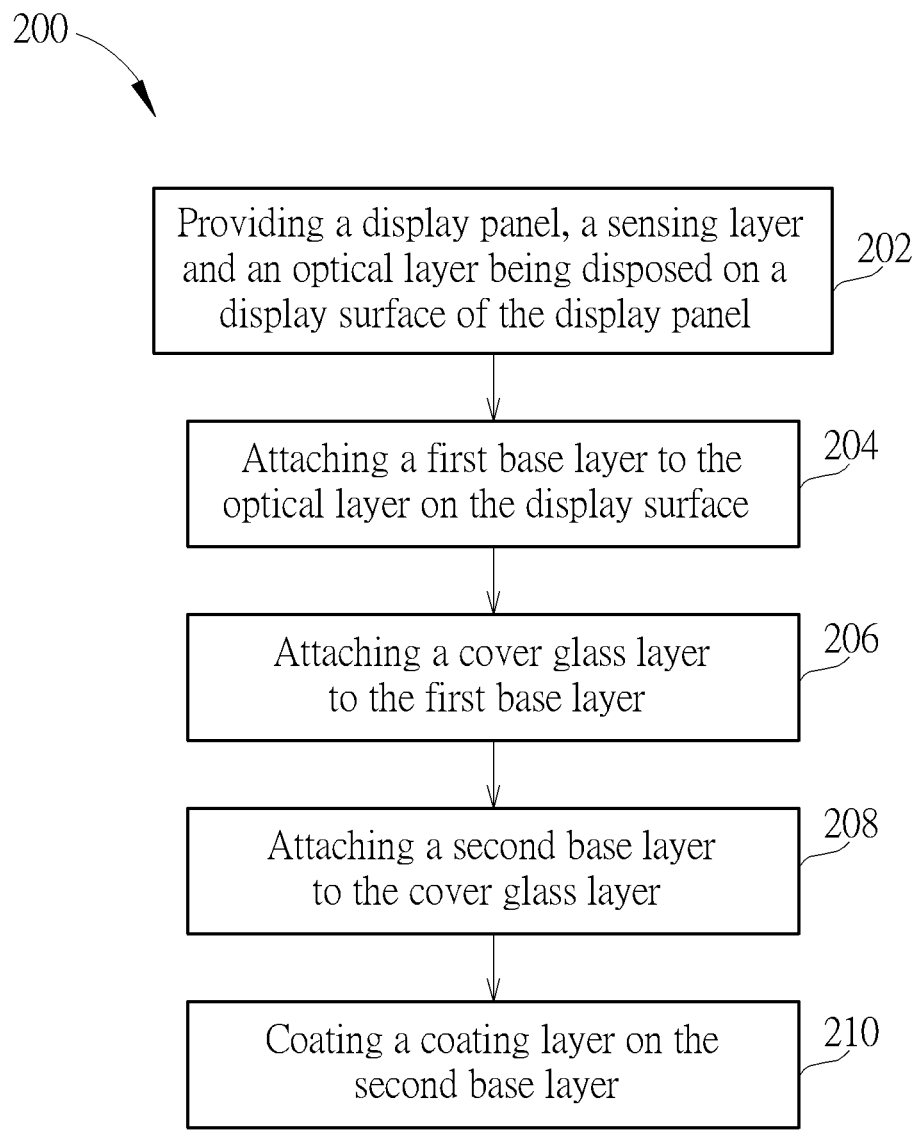
FIG. 2 is a flowchart showing the steps for forming a display device according to an embodiment of the present disclosure.

FIG. 2 is a flowchart of a manufacturing process 200 for forming a display device according to an embodiment of the present disclosure, such as the display device 10 shown in FIG. 1. Please refer to FIG. 1 and FIG. 2 at the same time in the following description for the ease of understanding.

As shown in FIG. 2, the manufacturing process 200 begins at the step 202, providing a display panel, wherein a sensing layer and an optical layer are disposed on a display surface of the display panel. The display panel, such as the display panel DP shown in FIG. 1, wherein a sensing layer 104 and an optical layer 106 are disposed on the front surface DP1 (the display surface) of the display panel DP. According to an embodiment of the present disclosure, the back surface DP2 of the display panel DP may be temporarily disposed on a temporary carrier substrate (not shown) to obtain support during the manufacturing process 200.

Subsequently, in the step 204, a first base layer is attached to the optical layer. The first base layer may be the third layer 122 of the display device 10 shown in FIG. 1. In some embodiments, the third layer 122 may be formed by directly coating the material of the third layer 122 (such as PET) onto the optical layer 106 and then curing the material (such as photocuring or thermal curing). In some embodiments, the third layer 122 may be formed and cured externally, and then be attached to the optical layer 106 through an adhering process. In this case, an adhesive layer (not shown in FIG. 1) may be disposed between the third layer 122 and the optical layer 106.

Subsequently, in the step 206, a cover glass layer is attached to the first base layer. The cover glass layer may be the fourth layer GL of the display device 10 shown in FIG. 1. The fourth layer GL may be attached to the third layer 122 by the adhesive layer 134.

Subsequently, in the step 208, a second base layer is attached to the cover glass layer. The second base layer may be the first layer 124 of the display device 10 shown in FIG. 1. In some embodiments, the first layer 124 may be formed by directly coating the material of the first layer 124 (such as PET) onto the fourth layer GL and then curing the material (such as photocuring or thermal curing). In some embodiments, the first layer 124 may be formed and cured externally, and then be attached to the fourth layer GL through an adhering process. In this case, an adhesive layer (not shown in FIG. 1) may be disposed between the first layer 124 and the fourth layer GL.

Subsequently, in the step 210, a coating layer is coated on the second base layer and cured (by thermal curing or photocuring process) to become a hard coating layer, such as the second layer 126. Following, after removing the temporary carrier substrate (not shown) from the back surface DP2 of the display panel DP, the supporting layer 110 is attached to the back surface DP2 of the display panel DP.

Figure 3:
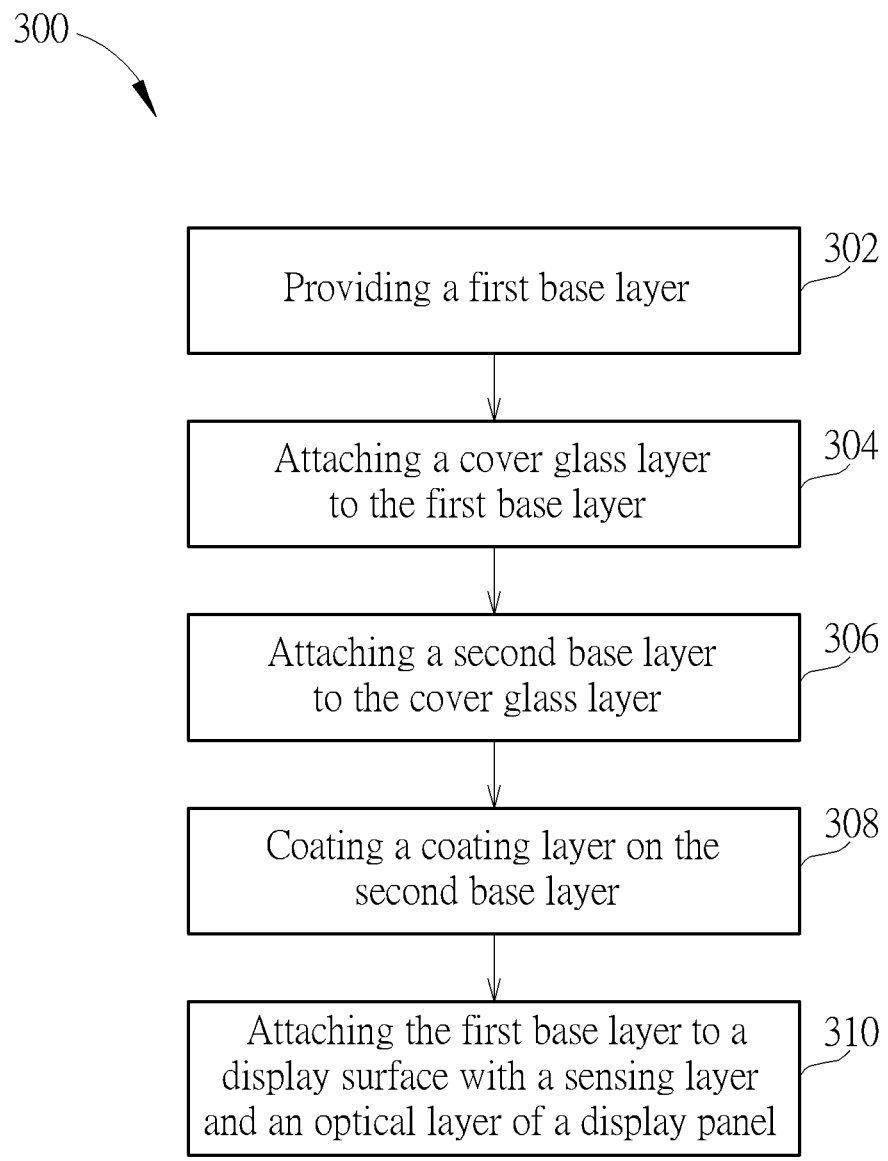
FIG. 3 is a flowchart showing the steps for forming a display device according to an embodiment of the present disclosure.

FIG. 3 is a flowchart of a manufacturing process 300 for forming a display device according to an embodiment of the present disclosure, such as the display device 10 shown in FIG. 1. Please refer to FIG. 1 and FIG. 3 at the same time in the following description for the ease of understanding. Different from the manufacturing method 200 where the first base layer, the cover glass layer, the second base layer and the coating layer (hardened coating layer) are sequentially attached onto the front surface (display surface) of the display panel, in the manufacturing method 300 the cover glass layer, the second base layer and coating layer (hard coating layer) are formed on the first base layer, and then the first base layer is attached onto the front surface (display surface) of the display panel.

As shown in FIG. 3, the manufacturing process 300 begins at the step 302, providing a first base layer. The first base layer may be the third layer 122 of the display device 10 shown in FIG. 1, and may be a PET film.

Subsequently, in the step 304, a cover glass layer is attached to the first base layer. The cover glass layer may be the fourth layer GL of the display device 10 shown in FIG.

1. In some embodiments, the fourth layer GL is attached onto the third layer 122 by the adhesive layer 134.

Subsequently, in the step 306, a second base layer is attached to the cover glass layer. The second base layer may be the first layer 124 of the display device 10 shown in FIG. 1. In some embodiments, the first layer 124 may be formed by directly coating the material of the first layer 124 (such as PET) onto the fourth layer GL and then curing the material (such as photocuring or thermal curing). In some embodiments, the first layer 124 may be formed and cured externally, and then be attached to the fourth layer GL through an adhering process. In this case, an adhesive layer (not shown in FIG. 1) may be disposed between the first layer 124 and the fourth layer GL.

Subsequently, in the step 308, a coating layer is coated on the second base layer and cured (by thermal curing or photocuring process) to become a hard coating layer, such as the second layer 126. At this point, the cover layer 120 of the display device 10 shown in FIG. 1 is obtained.

Subsequently, in the step 310, providing a display panel with a display surface (front surface) having a sensing layer and an optical layer disposed thereon, and attaching the first base layer to the display surface of the display panel. More specifically, as shown in FIG. 1, the third surface 122 of the cover layer 120 is attached or adhered to the optical layer 106 of the display panel DP. In this embodiment, the third layer 122 may be attached to the optical layer 106 through an adhering process, so that an adhesive layer (not shown) may be disposed between the third layer 122 and the optical layer 106. In some embodiments, the display panel DP may be temporarily attached to a temporary carrier substrate (not shown) on its back surface DP2 that is opposite to the front surface DP1 (display surface). After the step 310 has been finished, the temporary carrier substrate is removed from the back surface DP2, and then the supporting layer 110 is attached to the back surface DP2 of the display panel 10. Alternatively, in other embodiments, the back surface DP2 of the display panel 10 may have been attached on the supporting layer 110 during the step 310.

Figure 4:
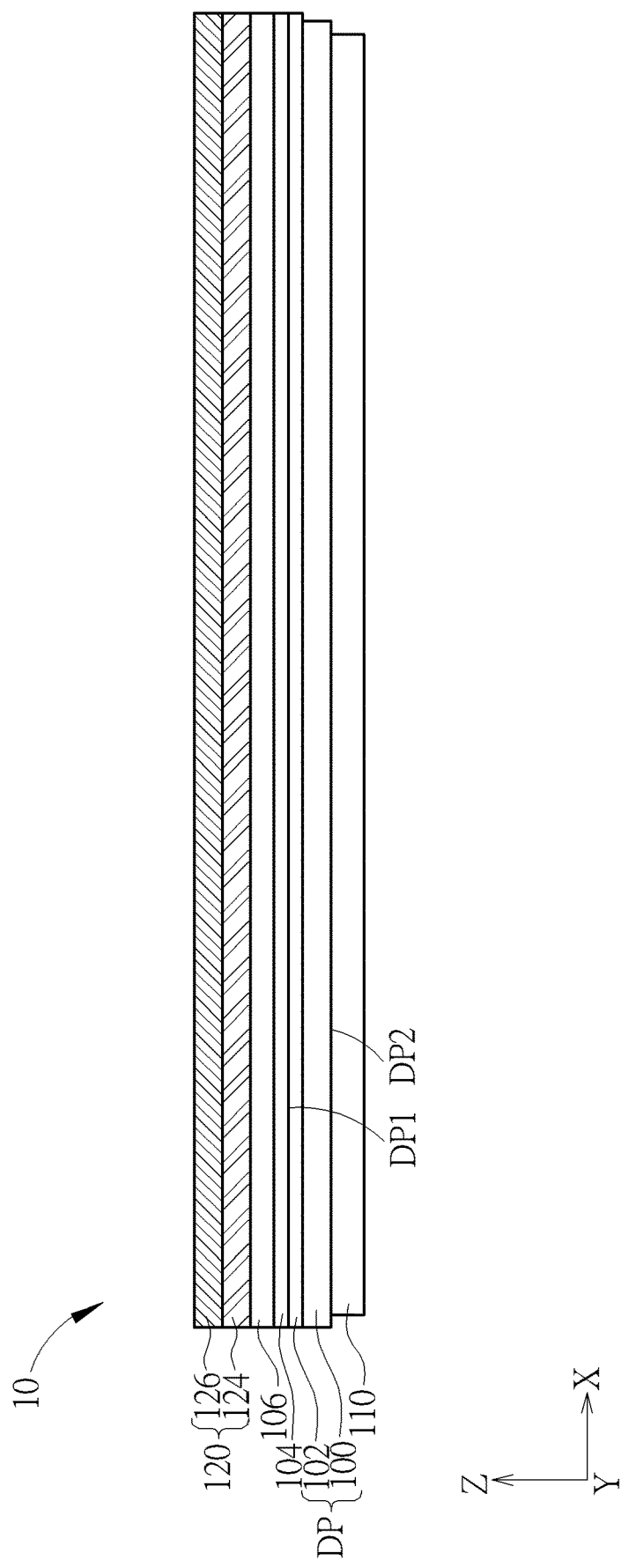
FIG. 4 is a schematic diagram showing a cross-sectional view of a display device according to an embodiment of the present disclosure.

FIG. 4 is a schematic diagram showing a cross-sectional view of a display device 10 along the XZ plane according to an embodiment of the present disclosure. A difference between FIG. 1 and FIG. 4 is that, the cover layer 120 of the display device 10 shown in FIG. 4 does not include the third layer 122, the fourth layer GL and the adhesive layer 134, and the first layer 124 is directly attached to the optical layer 106. For example, the first layer 124 may be formed by directly coating the material of the first layer 124 (such as PET) onto the optical layer 106 and then curing the material (such as photocuring or thermal curing). In comparison with the cover layer 120 shown in FIG. 1, the cover layer 120 shown in FIG. 4 may be thinner, so that the sensitivities of the fingerprint sensors and/or touch sensors of the sensing layer 104 may be improved.

Figure 5:
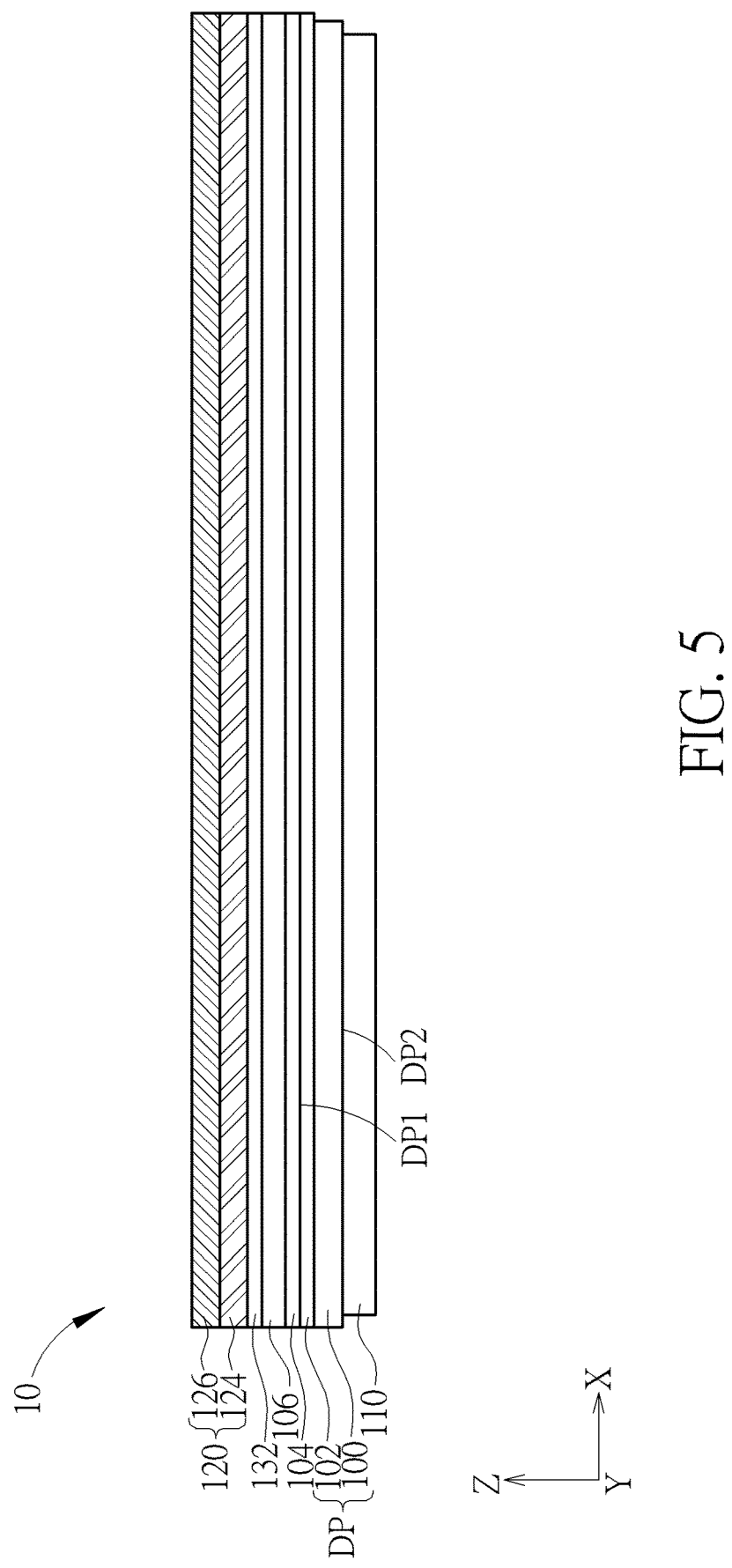
FIG. 5 is a schematic diagram showing a cross-sectional view of a display device according to an embodiment of the present disclosure.

FIG. 5 is a schematic diagram showing a cross-sectional view of a display device 10 along the XZ plane according to an embodiment of the present disclosure. A difference between FIG. 1 and FIG. 5 is that, the cover layer 120 of the display device 10 shown in FIG. 5 does not include the third layer 122, the fourth layer GL and the adhesive layer 134, and the first layer 124 is attached to the optical layer 106 through an adhesive layer 132. The adhesive layer 132 may include acrylate based adhesive or epoxy adhesive, but is not limited thereto. The thickness of the adhesive layer 132 may range from 20 μm to 50 μm (20 μm≤thickness≤50 μm). For example, the thickness of the adhesive layer 132 may be approximately 25 μm, 30 μm, 40 μm, 45 μm, or a thickness within a range defined by the above. The adhesive layer 132 may form a more intimate bonding between the first layer 124 and the optical layer 106.

Figure 6:
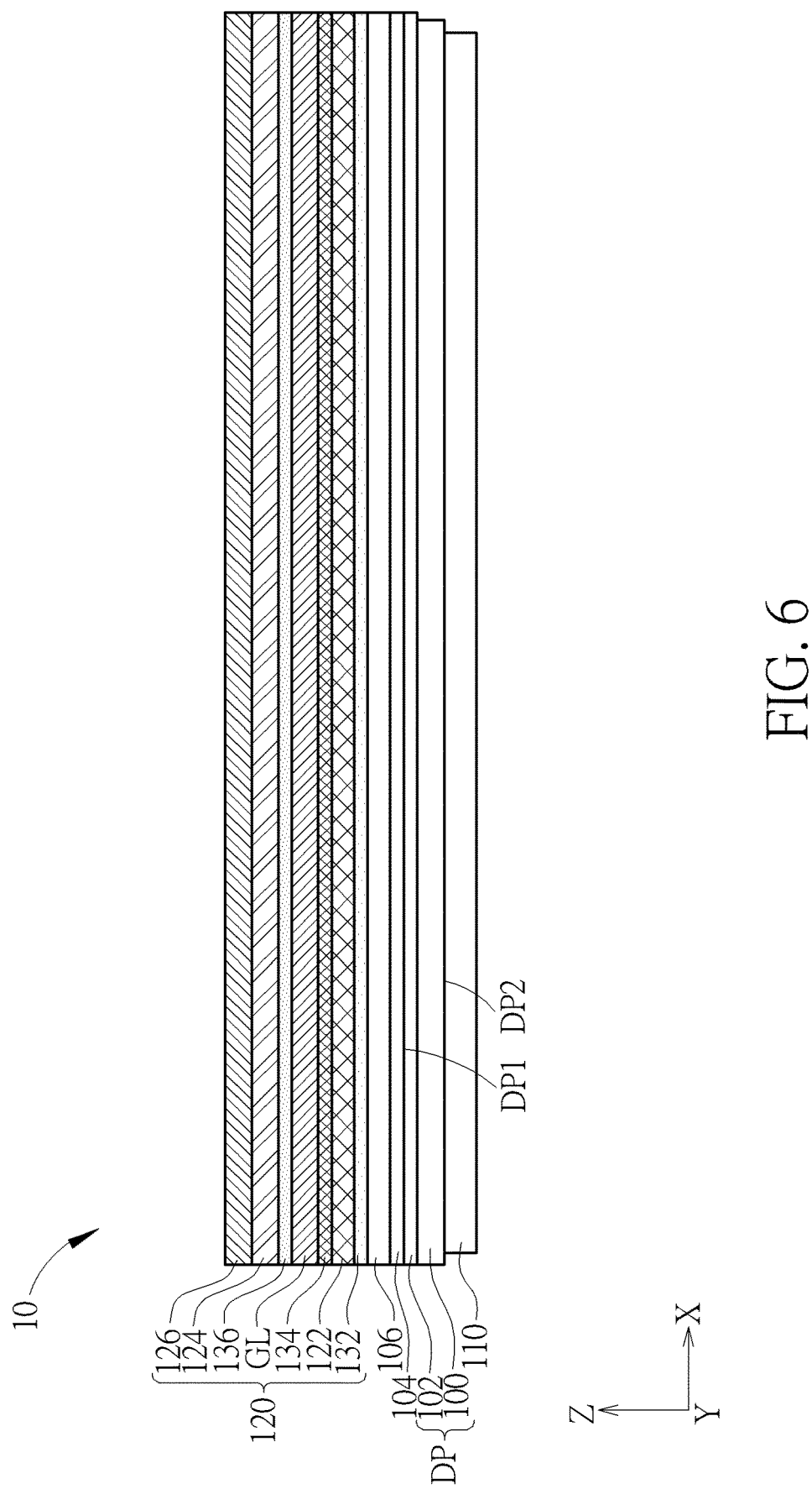
FIG. 6 is a schematic diagram showing a cross-sectional view of a display device according to an embodiment of the present disclosure.

FIG. 6 is a schematic diagram showing a cross-sectional view of a display device 10 along the XZ plane according to an embodiment of the present disclosure. Like the embodiment shown in FIG. 1, the cover layer 120 of the display device 10 shown in FIG. 6 includes a first layer 124, a second layer 126 disposed on the first layer 124, a third layer 122 disposed between the first layer 124 and the optical layer 106, a fourth layer GL disposed between the first layer 124 and the third layer 122, and an adhesive layer 134 disposed between the third layer and the fourth layer GL. A difference between FIG. 1 and FIG. 6 is that, the third layer 122 shown in FIG. 6 is attached to the optical layer 106 through an adhesive layer 132, and the first layer 124 shown in FIG. 6 is attached to the fourth layer GK through an adhesive layer 136. The adhesive layer 132 and the adhesive layer 136 may respectively include acrylate based adhesive or epoxy adhesive, but is not limited thereto. The thicknesses of the adhesive layer 132, the adhesive layer 134, and the adhesive layer 136 may respectively range from 20 μm to 50 μm (20 μm≤thickness≤50 μm). For example, the thicknesses of the adhesive layers 132, 134, 136 may respectively be about 25 μm, 30 μm, 40 μm, 45 μm, or a thickness within a range defined by the above.

Figure 7:
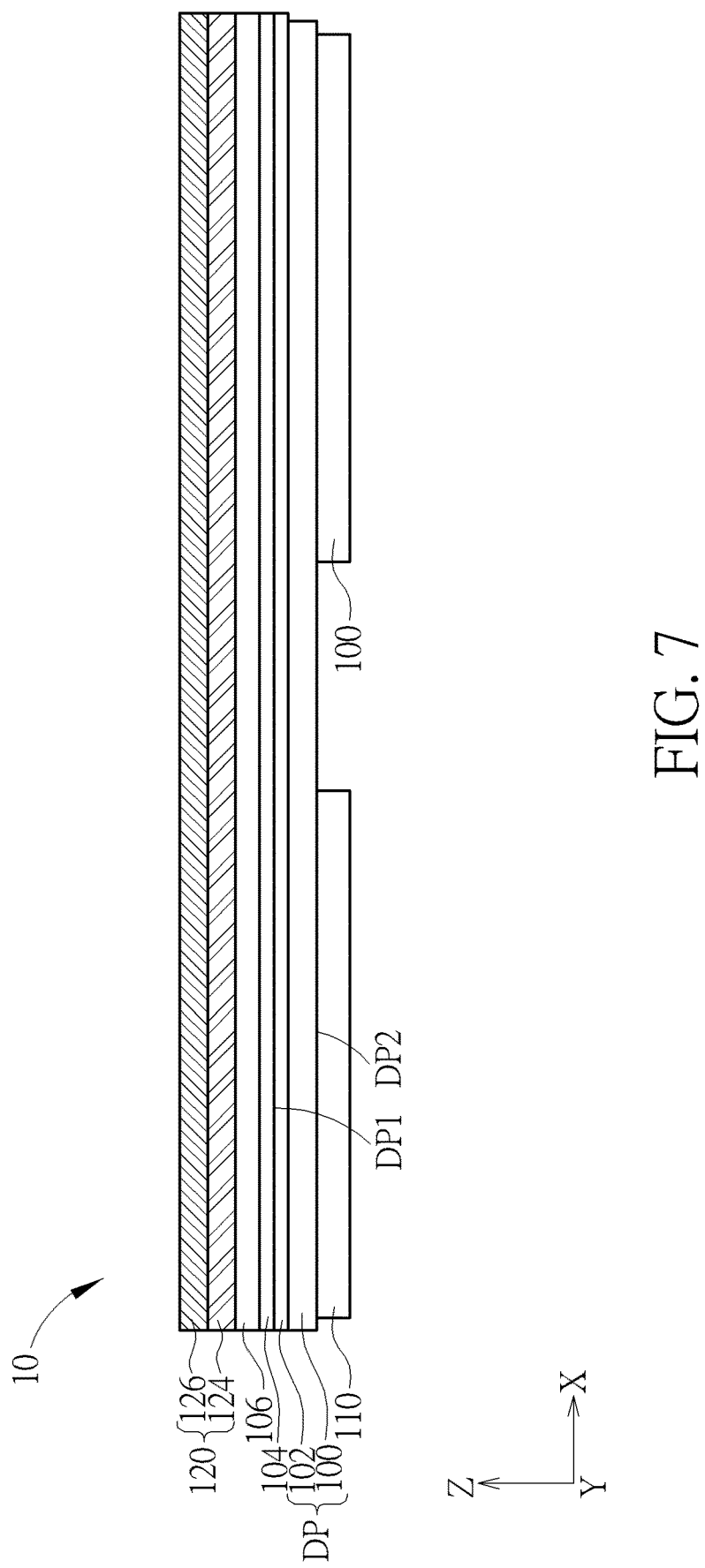
FIG. 7 is a schematic diagram showing a cross-sectional view of a display device according to an embodiment of the present disclosure.

FIG. 7 is a schematic diagram showing a cross-sectional view of a display device 10 along the XZ plane according to an embodiment of the present disclosure. The cover layer of the present disclosure may be applied to various deformable display devices, such as foldable, flexible, or stretchable display devices. For example, the display device 10 shown in FIG. 7 may be a foldable display device which includes a display panel DP having a flexible substrate 100 and two separated supporting layers 100 attached to the back surface DP2 of the display panel DP. According to an embodiment of the present disclosure, the display device 10 may be an outward folding display device, wherein the supporting layer 110 is located inside the display device 10 and the cover layer 120 (display surface of the display panel DP) faces the outside when the display device 10 is folded. Alternatively, in other embodiments, the display device 10 may be an inward folding display device, wherein the supporting layer 110 faces the outside and the cover layer 120 (display surface of the display panel DP) is located inside of the display device 10 when the display device 10 is folded.

FIG. 8 is a schematic diagram showing a plan view of a display device 10 along the XY plane (the plan defined by the X direction and the Y direction) according to an embodiment of the present disclosure. The display device 10 includes a substrate 100 including at least a display device layer, a sensing layer, an optical layer, and a cover layer (such as the display device layer 102, the sensing layer 104, the optical layer 106 and the cover layer 120 shown in FIG. 1) disposed thereon. The above layers are not shown in FIG. 8 for the sake of simplicity. The substrate 100 includes a display area DA and a peripheral area NDA surrounding the display area DA. The display area DA may include display units and signal lines for controlling the display units, wherein the signal lines may include pixel electrodes, scan lines, data lines, light-emitting control lines, power lines, ground lines, and/or clock signal lines according to design of the display units, but is not limited thereto. The peripheral area NDA may include peripheral circuits for controlling the operation of the display units in the display area DA, wherein the peripheral circuits may include driving devices, reset devices, compensate devices, initializing devices, operation controlling devices, light-emitting controlling devices, capacitors, inductors, power lines, or a combination thereof.

As shown in FIG. 8, the substrate 100 further includes a touch sensing area 100a and a fingerprint sensing area 100b, which respectively overlap with different regions of the display area DA. The fingerprint sensor in the fingerprint sensing area 100b and the touch sensor in the touch sensing area 100a are the same type of sensors, such as capacitive-type sensors and may be conveniently formed in the same layer (such as the sensing layer 104 shown in FIG. 1) to achieve a slimmer shape and/or lower cost. In the example as shown in FIG. 8, the touch sensing area 100a may include mutual capacitance type touch sensors, including a plurality of first axial electrodes 104a and second axial electrodes 104b that are perpendicular to the first axial electrodes 104a to form a mesh pattern. Each of the first axial electrodes 104a may include a plurality of sensing electrodes 104a1 and a plurality of bridge electrodes 104a2 connected between the sensing electrodes 104a1. Each of the second axial electrodes 104b may include a plurality of sensing electrodes 104b1 and a plurality of bridge electrodes 104b2 connected between the sensing electrodes 104b1. The sensing electrodes 104a1 and 104b1 are arranged side by side and respectively have an approximate diamond shape, but is not limited thereto. The touch sensing area 100a may detect a touch signal by respectively using the first axial electrode 104a or the second axial electrodes 104b as the touch driving electrodes and the touch sensing electrodes that work cooperatively to detect mutual capacitance between adjacent electrodes, and then calculating the capacitance differences to obtain the address of the touch location. The fingerprint sensing area 100b of the display device 10 shown in FIG. 8 may include self-capacitance type fingerprint sensors, including a plurality of separated sensing electrodes 104c that are arranged along the X direction and the Y direction to form an array. The fingerprint sensing area 100b may perform fingerprint recognition by detecting respective capacitances of the sensing electrodes 104c, and then calculating the capacitance differences to obtain the addresses of the ridge patterns and groove patterns of the fingerprint. In the embodiment shown in FIG. 8, the maximum dimension of a single sensing electrode 104c in the fingerprint sensing area 100b is smaller than the maximum dimension of a single sensing electrode 104a1 and/or 104b1 of the first axial electrodes 104a and/or the second axial electrodes 104b in the touch sensing area 100a. The first axial electrodes 104a and the second axial electrode 104b in the touch sensing area 100a and the sensing electrodes 104c in the fingerprint sensing area 100b are all fabricated in the sensing layer (such as the sensing layer 104 shown in FIG. 1) on the substrate 100. As shown in FIG. 8, the touch sensing area 100a and the fingerprint sensing area 100b are separated by a space gap1 and/or a space gap2, wherein the space gap1 extends approximately along the X direction, and the space gap2 extends approximately along the Y direction. The width of the space gap1 and the width of the space gap2 are approximately the same. In addition, if there is no clear boundary between the touch sensing area 100a and the fingerprint sensing area 100b, the width of the space gap1 may be the shortest distance along the Y direction between the first axial electrodes 104a and the sensing electrodes 104c, and the width of the space gap2 may be the shortest distance along the X direction between the second axial electrodes 104b and the sensing electrodes 104c, but is not limited thereto. In some embodiments, the width of the space gap1 and the width of the space gap2 may be different. In some embodiments, the first axial electrodes 104a and/or the second axial electrodes 104b may respectively include dummy electrodes (not shown) which may be disposed adjacent to the sensing electrodes 104c and without touch sensing function.

FIG. 9 is a schematic diagram showing a plan view of a display device 10 along the XY plane (the plan defined by the X direction and the Y direction) according to an embodiment of the present disclosure. A difference between FIG. 8 and FIG. 9 is that, the fingerprint sensing area 100b of the display device 10 shown in FIG. 8 may include mutual capacitance type fingerprint sensor, including a plurality of first axial electrodes 104d and second axial electrodes 104e that are perpendicular to the first axial electrodes 104d to form a mesh pattern. Each of the first axial electrodes 104d may include a plurality of sensing electrodes 104d1 and a plurality of bridge electrodes 104d2 connected between the sensing electrodes 104d1. Each of the second axial electrodes 104e may include a plurality of sensing electrodes 104e1 and a plurality of bridge electrodes 104e2 connected between the sensing electrodes 104e1. The sensing electrodes 104d1 and 104e1 are arranged side by side and respectively have an approximate diamond shape, but is not limited thereto. In the embodiment shown in FIG. 9, the maximum dimension of a single sensing electrode 104d1 of the first axial electrodes 104d and/or a single sensing electrode 104e1 of the second axial electrodes 104e in the fingerprint sensing region 100b is smaller than the maximum dimension of a single sensing electrode 104a1 of the first axial electrodes 104a and/or a single sensing electrode 104b1 of the second axial electrodes 104b in the touch sensing area 100a. As shown in FIG. 9, the touch sensing area 100a and the fingerprint sensing area 100b are separated by a space gap1 and/or a space gap2, wherein the space gap1 extends approximately along the direction X, and the space gap2 extends approximately along the Y direction. The width of the space gap1 may be larger than the width of the space gap2. In addition, if there is no clear boundary between the touch sensing area 100a and the fingerprint sensing area 100b, the width of the space gap1 may be the shortest distance along the Y direction between the first axial electrodes 104a and the first axial electrodes 104d, and the width of the space gap2 may be the shortest distance along the X direction between the second axial electrodes 104b and the second axial electrodes 104e, but is not limited thereto. In some embodiments, the width of the space gap1 may be smaller than the width of the space gap2. In some embodiments, the first axial electrodes 104a and/or the second axial electrodes 104b may respectively include dummy electrodes (not shown), wherein the dummy electrodes may be disposed adjacent to the first axial electrodes 104d and/or the second axial electrodes 104e and without touch sensing function. In some embodiments, the first axial electrodes 104d and/or the second axial electrodes 104e may respectively include dummy electrodes (not shown) which may be disposed adjacent to the first axial electrodes 104a and/or the second axial electrodes 104b in the touch sensing region 100a and without touch sensing function.

FIG. 10 is a schematic diagram showing a plan view of a display device 10 along the XY plane (the plan defined by the X direction and the Y direction) according to an embodiment of the present disclosure. A difference between FIG. 8 and FIG. 10 is that, the touch sensing area 100a and the fingerprint sensing area 100b of the display device 10 shown in FIG. 10 are overlapped, including a plurality of first axial electrodes 104f and second axial electrodes 104g that are perpendicular to the first axial electrodes 104f. Each of the first axial electrodes 104f may include a plurality of sensing electrodes 104f1 and a plurality of bridge electrodes 104f2 connected between the sensing electrodes 104f1. Each of the second axial electrodes 104g may include a plurality of sensing electrodes 104g1 and a plurality of bridge electrodes 104g2 connected between the sensing electrodes 104g1. The sensing electrodes 104f1 and 104g1 are arranged side by side and respectively have an approximate diamond shape, but is not limited thereto. The first axial electrodes 104f and the second axial electrodes 104g may perform touch sensing or fingerprint sensing functions at different times by controlling system clock and algorithm. That is, the first axial electrodes 104f and the second axial electrodes 104g may be used as touch sensors or fingerprint sensors in different operation modes.

It should be noted that the display devices 10 shown in FIG. 8, FIG. 9 and FIG. 10 may respectively include a cover layer disposed on the substrate 100, such as the cover layer 120 as shown in FIG. 1, FIG. 4, FIG. 5, FIG. 6, or FIG. 7, and may be made through the manufacturing process as shown in FIG. 2 or FIG. 3.

Figure 11:
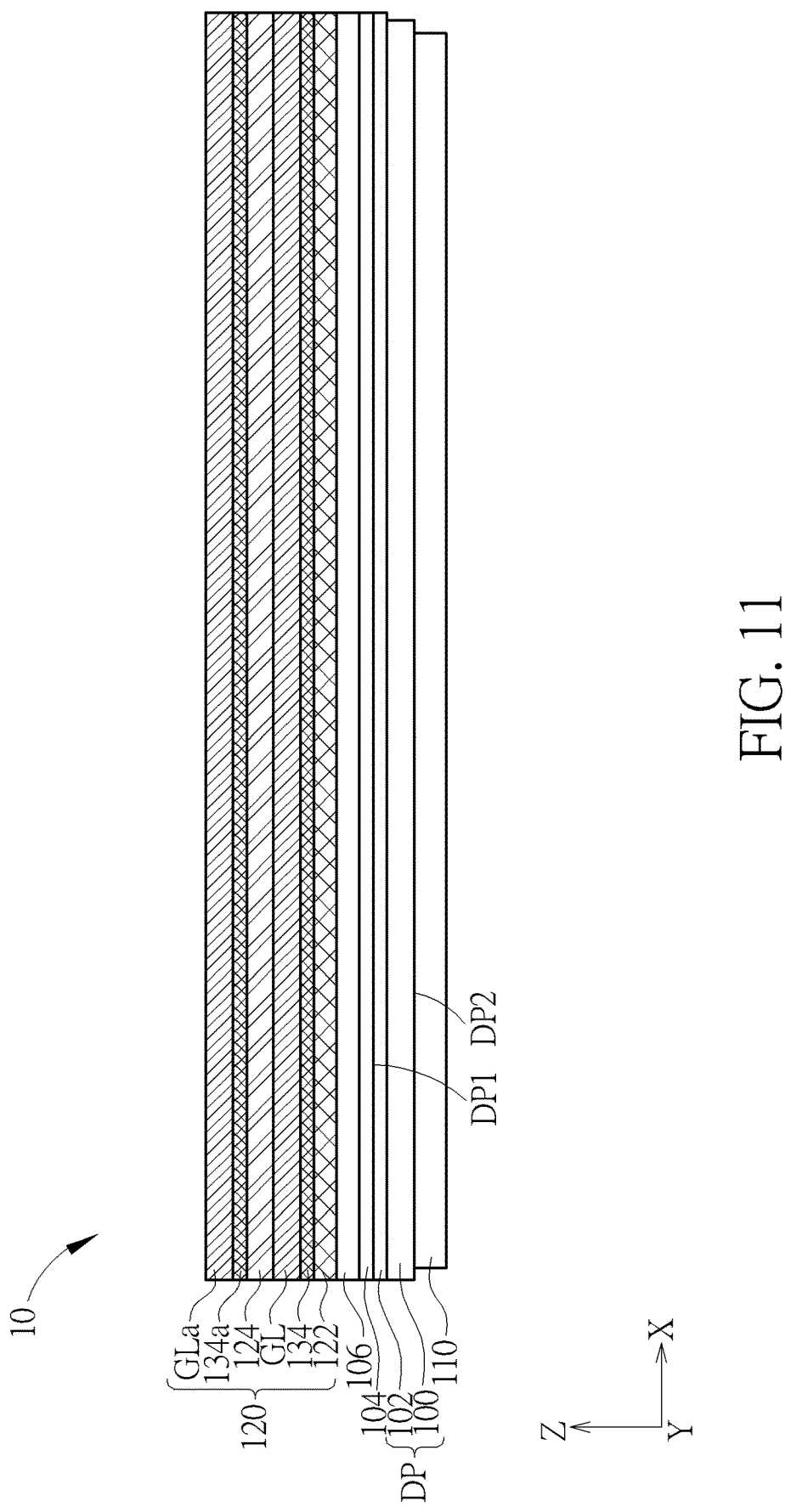
FIG. 11 is a schematic diagram showing a cross-sectional view of a display device according to an embodiment of the present disclosure.

FIG. 11 is a schematic diagram showing a cross-sectional view of a display device 10 along the XZ plane according to an embodiment of the present disclosure. In this embodiment, the second layer GLa disposed on the first layer 124 of the cover layer 120 may be made of a glass material. Different from the display device 10 shown in FIG. 1 which uses the second layer 126 made of a hard coating layer as the user touching layer, the display device 10 shown in FIG. 11 uses the second layer GLa made of a glass material as the user touching layer. The thickness of the second layer GLa may range from 20 μm to 60 μm (20 μm≤thickness≤60 μm). For example, the thickness of the second layer GLa may be approximately 25 μm, 30 μm, 40 μm, 50 μm, or a thickness within a range defined by the above. According to an embodiment of the present disclosure, an adhesive layer 134a may be disposed between the second layer GLa and the first layer 124. The thickness of the adhesive layer 134a may range from 20 μm to 50 μm (20 μm≤thickness≤50 μm). For example, the thickness of the adhesive layer 134a may be approximately 25 μm, 30 μm, 40 μm, 45 μm, or a thickness within a range defined by the above.

Figure 12:
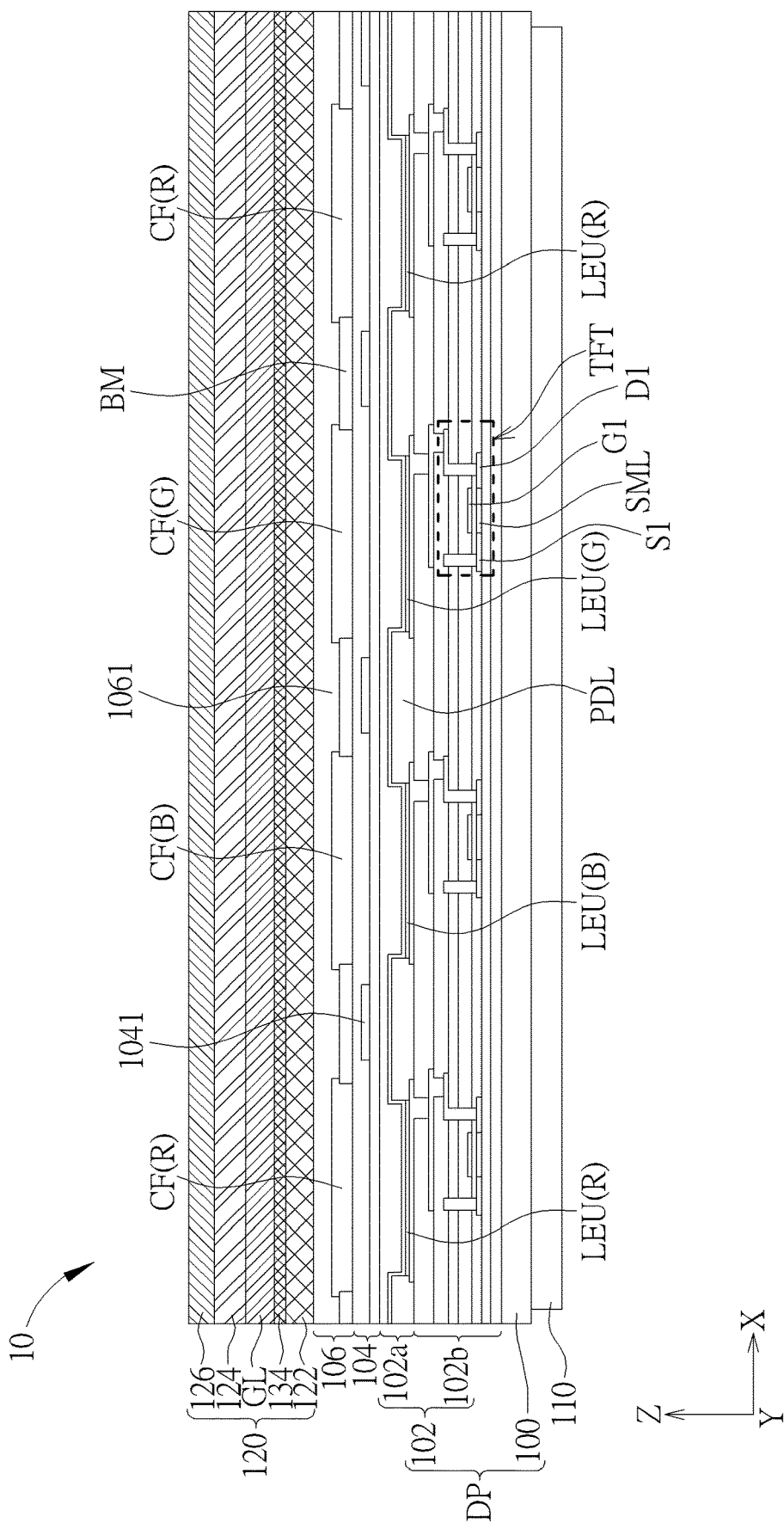
FIG. 12 is a schematic diagram showing a cross-sectional view of a display device according to an embodiment of the present disclosure.

FIG. 12 is a schematic diagram showing a cross-sectional view of a display device 10 along the XZ plane according to an embodiment of the present disclosure. In some embodiments, the display device 10 may be a self-light-emitting display device, including a display panel DP, a supporting layer 110 disposed under the display panel DP, a sensing layer 104 disposed on the display panel DP, an optical layer 106 disposed on the sensing layer 104, and a cover layer 120 disposed on the optical layer 106. As illustrated in previous sections, the cover layer 120 may include a first layer 124, a second layer 126 disposed on the first layer 124. Optionally, the cover layer 120 may further include a third layer 122 disposed between the first layer 124 and the optical layer 106, a fourth layer GL disposed between the first layer 124 and the third layer 122, and an adhesive layer 134 disposed between the third layer 122 and the fourth layer GL. As shown in FIG. 12, the display panel DP includes a substrate 100 and a display device layer 102 disposed on the substrate 100. The display device layer 102 may include a circuit layer 102b and a display unit layer 102a disposed on the circuit layer 102b. The display unit layer 102a may include pixel define layers PDL to define the pixel regions and display units disposed between the pixel define layers PDL. According to an embodiment of the present disclosure, the display units may include red display units LEU(R), blue display units LEU(B), and green display units LEU(G). The circuit layer 102b includes a plurality of transistors TFT, respectively and electrically connected to one of the red display units LEU(R), blue display units LEU(B), and green display units LEU(G) to control light emitting of the connected display unit. The transistors TFT may be silicon based thin film transistors, and may respectively include a semiconductor layer SML (such as a polysilicon, amorphous silicon or crystalline silicon layer), a gate electrode G1 disposed on the semiconductor layer SML, and a source region S1 and a drain region D1 in the semiconductor layer SML at two sides of the gate electrode G1. In other embodiments, the transistors TFT may include other kinds of transistors, such as oxide semiconductor thin film transistors, wherein the semiconductor layer SML is an oxide semiconductor layer. The optical layer 106 may include a color filter layer and an optical covering layer 1061, wherein the color filter layer may include red color regions CF(R) disposed corresponding to the red display units LEU(R), blue color regions CF(B) disposed corresponding to the blue display units LE((B), and green color regions CF(G) disposed corresponding to the green display units LEU(G). A black matrix BM (such as black polymer or black resin layer) is provided to separate different color regions of the color filter layer to reduce mixing of lights from different color regions. The red color regions CF(R), the blue color regions CF(B), the green color regions CF(G) and the black matrix BM are covered by the optical covering layer 1061. The optical covering layer 1061 may include optical clear adhesive (OCA), optical clear resin (OCR) or other suitable dielectric materials. The red color regions CF(R), the blue color regions CF(B), the green color regions CF(G) may filter lights of different colors and also provide anti-reflection functions. In the embodiments where the optical layer 106 includes a color filter layer, the sensing layer 104 may be disposed under the color filter layer, and the sensing electrodes 1041 (such as the first axial electrodes 104a, the second axial electrodes 104b and the sensing electrodes 104c shown in FIG. 8; the first axial electrodes 104a and 104d and the second axil electrodes 104b and 104e shown in FIG. 9; the first axial electrodes 104f and the second axial electrodes 104g) of the sensing layer 104 are overlapped with the black matrix BM along the vertical direction (such as the Z direction) to reduce reflection lights caused by the sensing electrodes 1041.

In conclusion, the present disclosure provides a display device which includes a cover layer with a multilayer structure and formed by multiple coating and/or adhesion processes. By choosing proper materials and suitable thicknesses of each of the component layers of the cover layer, the cover layer may have a reduced thickness to increase the sensitivities of sensors (such as fingerprint sensors and/or touch sensors) in the sensing layer while still providing sufficient protection to the display device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. A display device, comprising:
   a display panel;
   a sensing layer disposed on the display panel, the sensing layer comprising a fingerprint sensor;
   an optical layer disposed on the display panel; and a cover layer disposed on the optical layer, wherein the cover layer comprises:
   a first layer;
   a second layer disposed on the first layer;
   a third layer under the first layer; and
   a fourth layer between the first layer and the third layer, wherein the first layer, the second layer and the third layer are organic material layers, the fourth layer is an inorganic material layer and has a thickness ranged from 20 μm to 60 μm, and thicknesses of the first layer and the third layer are larger than a thickness of the fourth layer.

2. The display device according to claim 1, wherein an entire thickness of the cover layer is ranged from 0.05 mm to 0.5 mm.

3. The display device according to claim 2, wherein the entire thickness of the cover layer is ranged from 0.1 mm to 0.3 mm.

4. The display device according to claim 1, wherein a thickness of the first layer is greater than a thickness of the second layer.

5. The display device according to claim 1, wherein a thickness of the first layer is ranged from 30 μm to 100 μm.

6. The display device according to claim 1, wherein a thickness of the second layer is ranged from 4 μm to 20 μm.

7. The display device according to claim 1, wherein a thickness of the third layer is ranged from 30 μm to 100 μm.

8. The display device according to claim 1, wherein the cover layer further comprises:
   a first adhesive layer disposed between the third layer and the fourth layer; and
   a second adhesive layer disposed between the fourth layer and the first layer.

9. The display device according to claim 1, further comprising a third adhesive layer disposed between the optical layer and the cover layer.

10. The display device according to claim 1, wherein the fingerprint sensor is a capacitive-type fingerprint sensor.

11. The display device according to claim 1, wherein the sensing layer further comprises a touch sensor.

12. The display device according to claim 1, wherein the display device is a foldable display device.

* * * * *